United States Patent [19]
Mitchell et al.

[11] Patent Number: 5,365,438
[45] Date of Patent: Nov. 15, 1994

[54] AUDIBLE AND VISUAL FEEDBACK FOR USER STIMULATED SELF-TEST DIAGNOSTICS

[75] Inventors: Clair E. Mitchell, Detroit; Karl W. Wojcik, Sterling Heights; David J. Rutkowski, Grosse Ile; Peter Langer, Troy; Paul C. Dara, Warren, all of Mich.

[73] Assignee: Ford Motor Company, Dearborn, Mich.

[21] Appl. No.: 1,966

[22] Filed: Jan. 8, 1993

[51] Int. Cl.⁵ .............................................. G01M 15/00
[52] U.S. Cl. .............................. 364/424.03; 340/459; 340/660; 324/503; 324/524; 324/380; 324/384
[58] Field of Search .................. 364/424.03; 340/459, 340/660, 653; 324/503, 524, 542, 384, 380, 382, 304

[56] References Cited
U.S. PATENT DOCUMENTS

| | | | |
|---|---|---|---|
| 4,546,646 | 10/1985 | Takahashi | 73/117.3 |
| 4,843,557 | 6/1989 | Ina et al. | 364/431.77 |
| 4,884,033 | 11/1989 | McConchie, Sr. | 324/503 |
| 4,906,970 | 3/1990 | Momura | 340/459 |
| 4,908,792 | 3/1990 | Przybyla et al. | 364/900 |
| 4,910,494 | 3/1990 | Tamai | 340/438 |
| 4,924,398 | 5/1990 | Fujiwara | 364/431.11 |
| 4,969,099 | 11/1990 | Iwatsuki et al. | 364/424.03 |
| 4,975,848 | 12/1990 | Abe et al. | 364/424.03 |
| 5,003,478 | 3/1991 | Kobayashi et al. | 364/424.03 |
| 5,034,889 | 7/1991 | Abe | 364/424.04 |
| 5,041,976 | 8/1991 | Marko et al. | 364/424.03 |
| 5,072,391 | 12/1991 | Abe | 364/424.04 |

*Primary Examiner*—Thomas G. Black
*Assistant Examiner*—Julie D. Day
*Attorney, Agent, or Firm*—Richard D. Dixon; Roger L. May

[57] ABSTRACT

A plurality of sensors, such as a door handle lift switch, a headlight switch, and an ignition switch, are normally provided in an automotive electrical system. A master microcontroller normally is coupled to each of these sensors for receiving a signal therefrom and responsive thereto generating a corresponding controller signal. Power drivers, each operatively coupled to the master controller, normally are provided for energizing and powering loads coupled thereto, with each load being either an indicator or actuator that is operated responsive to its corresponding sensor. The self-diagnostic method includes the steps of mechanically actuating a selected one of the sensors, and then electrically actuating a first confirming indicator, such as an audible chime, indicative of the master controller receiving and successfully processing the corresponding sensing signal. A second confirming indicator, such as an illuminated lamp, is energized responsive to sensing that the master controller has energized the corresponding power driver responsive to receiving the sensing signal.

10 Claims, 3 Drawing Sheets

AUDIBLE AND VISUAL FEEDBACK FOR USER STIMULATED SELF-TEST DIAGNOSTICS

BACKGROUND OF THE INVENTION

1. Field of the Invention

This invention relates to a diagnostic apparatus for identifying faults occurring in an electronic control system of the type used for controlling electrical devices within an automobile. While the present invention is described with relation to the control of accessories within the vehicle, the system and method could also be used for controlling any subsystem of the vehicle that is electronically controlled, such as the ignition system, the transmission shifting mechanism, electronically controlled braking systems and traction control systems, power windows, etc.

2. Description of the Prior Art

A typical prior art solution to the problem of verifying the integrity and performance of an electrical accessory system is illustrated in U.S. Pat. No. 4,924,398 as including a separate testing unit that is removably coupled through a connector into the electrical system of the vehicle. The external testing system is utilized to interrogate and sense the proper operation of various electrical accessories.

Another prior art solution is disclosed in U.S. Pat. No. 4,908,792 wherein a separate ROM memory is provided for stimulating a microcontroller with a separate test program to exercise and sense the proper operation of the electrical system. This solution fails to test the operation of the microcontroller in conjunction with its originally programmed code.

In contrast to the prior art solutions, the present invention utilizes existing sensors, indicators/actuators, power drivers and microcontroller by enabling additional software in the microcontroller that will sense the signal from the actuated sensor and responsive thereto actuate an audible indicator for signalling that the sensor, the interconnect wiring to the controller and the microcontroller portion of the system are operating properly. The microcontroller will also sense a signal from each of the power drivers indicating that the power driver has received the control actuation signal from the microcontroller and responsive thereto has successfully changed the conductive state to apply or remove power coupled to the load. A visual indicator will be actuated indicating that the power driver has responded to the signal, with the visual signal being deactivated within approximately one second unless the power driver indicates that an open circuit or a shorted circuit is being sensed.

It is therefore a first object of the present invention to utilize existing sensors, wiring and microcontrollers, power drivers, actuators, and indicators within the automotive electrical system for indicating the proper operation of the subsystems, without resort to additional equipment that must be coupled to the vehicle system through wiring and connectors. It is also an object of the present invention to indicate that the sensor, interconnecting wiring and the microcontroller sections of the system are operating properly, as well as providing a separate indication that the microcontroller and power driver sections of the accessory system are operating properly.

SUMMARY OF THE INVENTION

A diagnostic system for determining operating faults in an automotive electrical system of the type including a plurality of existing sensors and switches for validating the condition of electrical subsystems in the vehicle. A microcontroller is coupled to the sensors for receiving signals therefrom and responsive thereto generating controller signals. A plurality of loads, including indicators and actuators are provided for indicating the status of and/or responding to commands from the sensors, with each indicator and actuator being paired with a corresponding one or more of the sensors. One of the indicators is designated as a first confirming audible indicator and another indicator is designated as a second confirming visual indicator, both functions being in addition to their normal vehicle indicator functions. A plurality of power drivers is provided, with each power driver being coupled to the controller and between a source of electrical energy and a corresponding load, for supplying power to vehicle accessories and indicators responsive to one of the controller signals.

The invention includes initiating means for placing the controller into a diagnostic mode in which the first and second confirming indicators are actuated responsive to first and second controller signals. First means are provided for actuating the first confirming indicator responsive to the controller receiving and processing the corresponding sensing signal from a stimulated sensor. Second means are provided for actuating the second confirming indicator responsive to the controller sensing that one of the power drivers paired with the stimulated sensor has coupled power to the circuit coupled to its corresponding load.

Thus, the first confirming indicator will confirm that the corresponding sensing signal has been received and processed by the controller, and the second confirming indicator will confirm that the controller has actuated the corresponding power driver. The system also includes means for generating a signal responsive to the controller sensing the corresponding power driver has coupled power to a defective shorted load, and for generating another signal responsive to the controller sensing that the corresponding power driver has coupled power to a defective open load.

BRIEF DESCRIPTION OF THE DRAWINGS

Other objects, features and advantages of the present invention will be apparent from a study of the specification and drawings in which.

DETAILED DESCRIPTION OF THE PREFERRED EMBODIMENT

Figure 1:
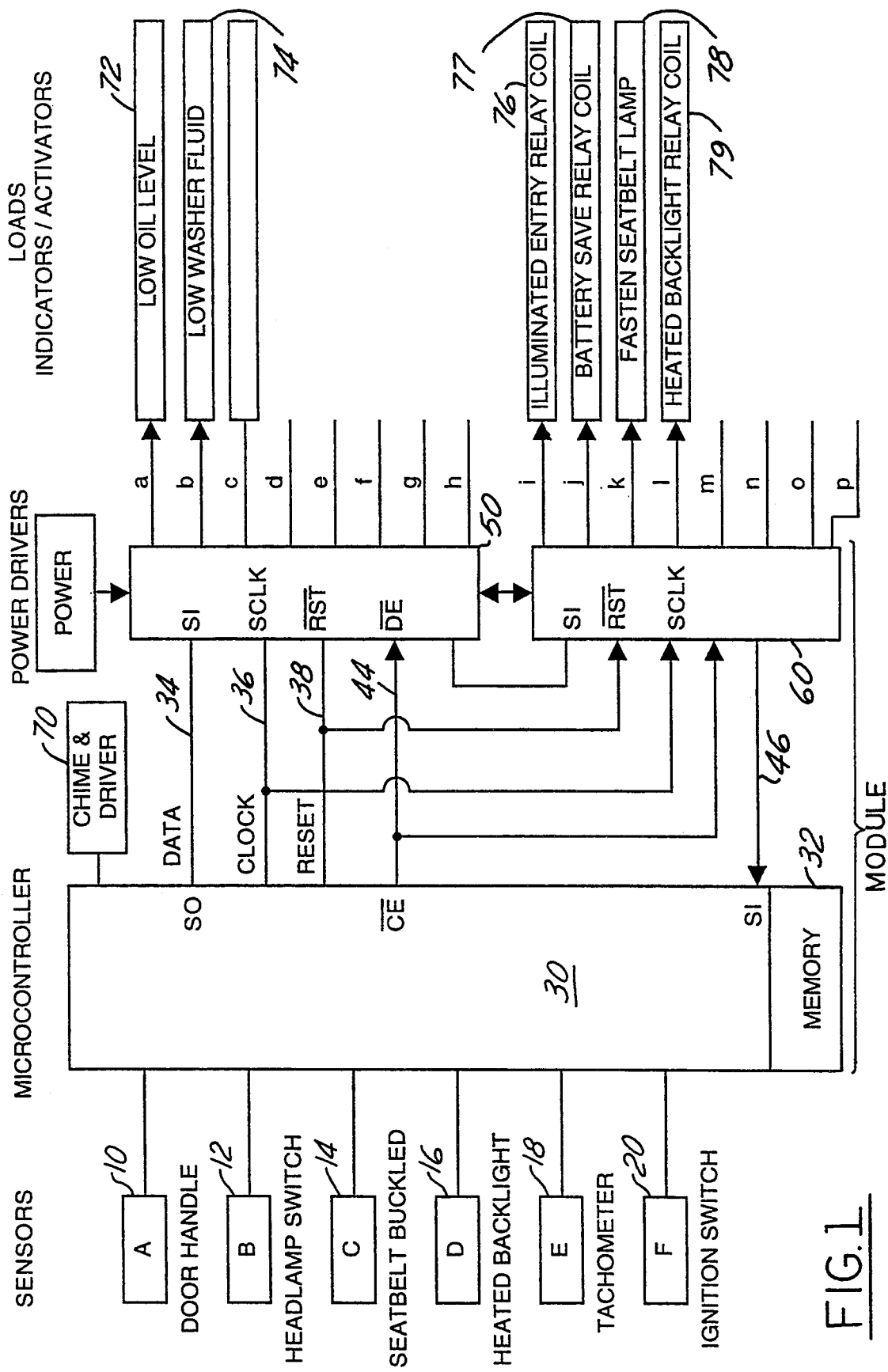
FIG. 1 is a schematic block diagram of the audible and visual feedback system for user stimulated self-test diagnostics.

With reference to FIG. 1, a series of sensors 10, 12, 14, and 16 are included in the automotive electrical system for sensing and actuating various accessories. In the preferred embodiment, a first sensor 10 is used for sensing the position of a door handle for the vehicle such that when the door handle is actuated the sensor 10 generates a signal that is coupled to a microcontroller 30. In a similar manner a second sensor 12 senses the condition of the headlamp switch, a third sensor 14 senses the condition of a seat belt buckle, and a fourth sensor 16 senses the condition of the heated back light switch. Still another sensor 20 senses whether the ignition switch is in the "off", the "acc" or the "run" position.

These sensors are illustrated as examples of a variety of other sensors within the automotive electrical system that are utilized in a similar manner. Additional examples of such sensors include sensors for sensing the status of an open door, a door lock being actuated, the door unlock switch being depressed, a memory lock being actuated, a windshield washer switch being actuated, a windshield wiper wash switch being actuated, a wiper mode switch being moved to the low speed position, a wiper mode switch being moved to the high speed position, a wiper mode switch being moved to the off or interval position, a window up switch being actuated, a one-touch window down switch being actuated, a seat belt not being buckled in a seat containing a passenger, an ignition switch being turned to the start position, a load leveling auxiliary switch being actuated, a load leveling disable switch being disabled, a load leveling disable switch being enabled, a height sensor switch being positioned to a high position and a height sensor then positioned to a low position.

While these vehicle accessory sensors have been illustrated as those utilized in the first preferred embodiment, it will be apparent to one skilled in the art that a variety of other vehicle sensors, including switches and sensors of other types, may also be utilized in conjunction with the present invention. These sensors have in common the fact that other indicators and/or actuators in the vehicle electrical system are actuated in response to the various conditions of each of the sensors. In the present invention each of the actuators and/or displays will be referred to as a load, with each load being paired with and generally corresponding to at least one of the sensors in a manner well known to those familiar with automotive electrical and electronic systems.

With continuing reference to FIG. 1, each of the aforementioned sensors is electrically coupled by wiring to the input of a microcontroller 30, which in the preferred embodiment comprises a model TMS370 manufactured by Texas Instruments Inc. of Dallas, Tex. The microcontroller 30 generally includes an internal memory 32 having both volatile and nonvolatile elements. The nonvolatile elements are generally used to retain the code necessary to run the microcontroller, and are also known as firmware (or software).

Since the output signals from the microcontroller 30 are usually of low drive capability, it is necessary to provide a power driver to be actuated by the microcontroller in order to couple a source of electrical energy to each of the loads. The coupling of power to one of the electrical loads is normally accomplished by wiring a source of positive voltage directly to the load and then coupling the low side of the load through the power driver to ground potential. While this low side power driver will be illustrated herein, the invention would also work well with a high side driver circuit.

A first power driver 50 and a second power driver 60 are illustrated as being coupled to the outputs of the microcontroller 30 generally through signal lines 34, 36, 38, 44, and 46. In the first preferred embodiment, power drivers 50 and 60 comprise Octal Serial Switches (OSS) manufactured by Motorola Inc. of Schaumberg, Ill. and designated with model no. MC33298. Octal Serial Switches 50 includes eight power drivers having outputs labeled as a, b, c, d, e, f, g, h, which are actuated in accordance with the signals coupled from the microcontroller 30 over the data line 34 in accordance with a Synchronous Serial Peripheral Interface (SPI) protocol.

At the falling edge of a chip enable (CE) signal on line 44, an output bit state (either 0 or 1) is transferred to shift registers (not illustrated) within the OSS, and the SCLK line 36 and SI Data In line 34 are gated into the shift registers. With the CE signal low (zero), data on the the SI line 34 is shifted into the shift registers on the falling edge of the SCLK pulse on line 36, and out of the shift registers (SO) on the rising edge of the SCLK pulse. As long as the CE signal on line 44 is low, the data will continue to shift through the shift registers from S1 through S8 within the OCC drivers with no change in the state of the output drivers. On the rising edge of the CE signal on line 44, data bits in the shift registers are parallel loaded into output latches of the output drivers, thereby causing them to turn on or turn off in response to receiving either a 0 or a 1 data bit.

The RESET signal on line 38 is an active low input signal that clears all registers of previous data, and sets all output drivers to the off state. It is used to reset the output drivers to off during the power up process until all supply voltages are at correct levels.

A 0 or 1 bit bit in the data word commands the corresponding power driver output to either assume the conducting or the nonconducting state, respectively. The OSS device has the ability to detect an open or shorted loads at each output of the power driver 50 and 60. As the serial data is transmitted out of power driver 50 through the SO port and into the serial input port SI on the second power driver 60, this data is then clocked back into the microcontroller 30 through the serial input line 46. In this manner the microcontroller can monitor the proper operation of each of the power drivers (a, b, . . . , p). The OSS devices are capable of detecting four possible faults, including over temperature, open load fault, short fault (over current), and over voltage fault.

The microcontroller 30 senses an error by comparing the commands previously transmitted on data line 34 to the received signals returned on the serial input line 46. If a 0 bit is transferred on the SI line 34 for a particular output to turn on, but the load coupled to that output is shorted, then the output would be turned off by its short circuit detection feature. On the next transmission of a 1 or 0 bit corresponding to that output, the SO data returned on line 46 would contain a 1 bit corresponding to that output, thereby indicating that the selected bit had been turned off due to the short circuit. Similarly, if a 1 bit is sent out to an output driver commanding it to turn off, and in the off state the output open load detection circuit detects an open load condition for that output driver, then the return bit corresponding to that output would be a 0 after a second subsequent transmission of a 1 or 0 bit to the output.

In this manner an error condition can be detected by exclusive "or"ing the last received data with the previous data. A logic 1 bit in the resultant of the exclusive "or"ing operation would indicate an error condition for the respective output. In this manner, shorted loads are reported as a 1 bit and an open load is reported a 0 bit on the return data word signal on line 46.

The ignition switch 20 has an additional function in the preferred embodiment. When the microcontroller 30 is operating in its normal mode, any actuation of one of the sensors 10, 12, 14, 16, etc. will be sensed by the microcontroller 30 and will result in one of the power drivers 50 or 60 being actuated responsive thereto. However, when the ignition switch 20 is switched from off to run and then off again in succession for three cycles within a predetermined period of time, the microcontroller 30 interprets this command as an instruction to execute additional diagnostic software from the nonvolatile memory 32. In the first preferred embodiment it should be emphasized that the normal software controlling the microcontroller 30 is disabled.

Figure 2A:
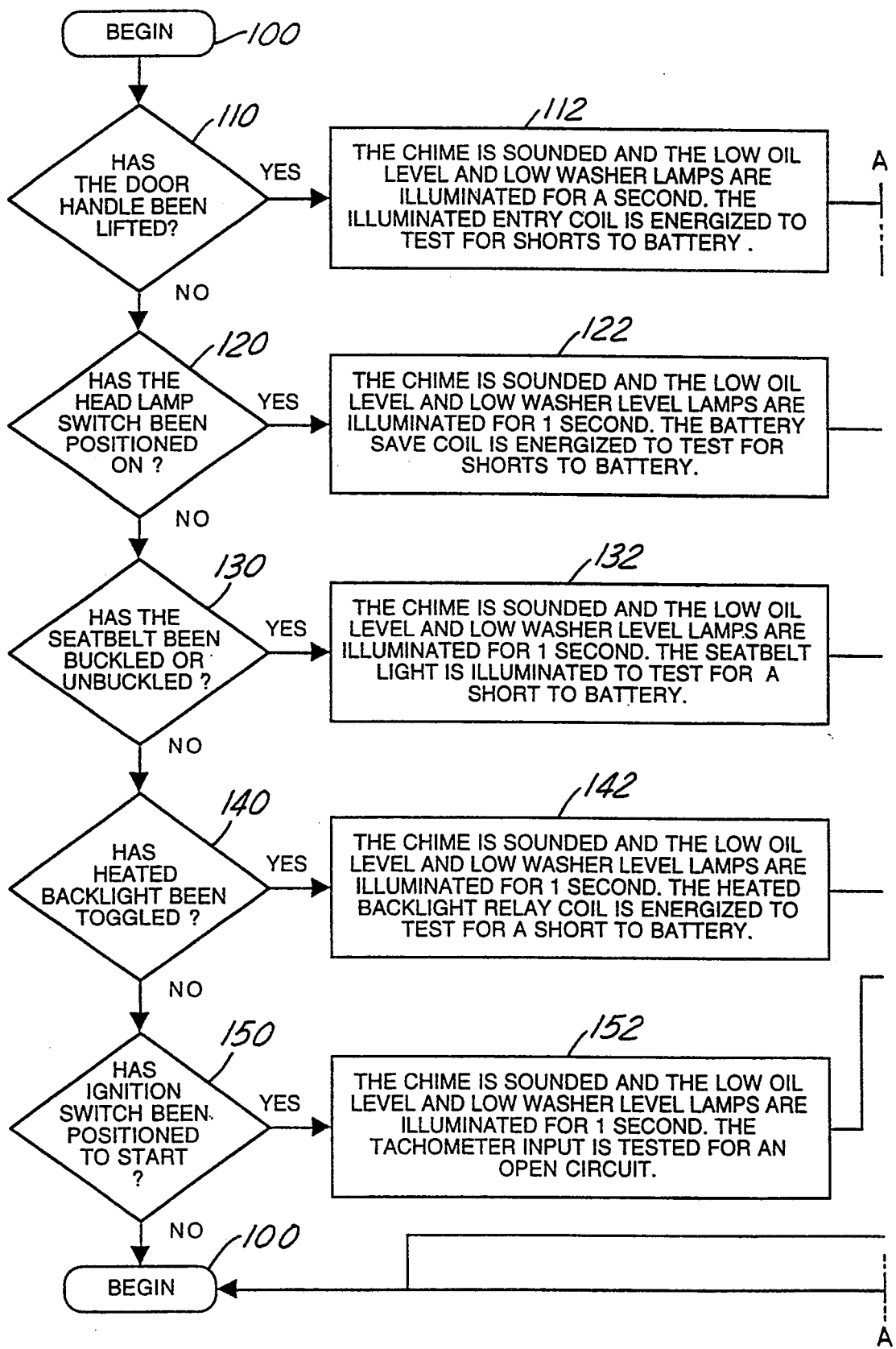
FIG. 2 is a schematic flow diagram for the diagnostic software executed by the microcontroller within the system.
Figure 2B:
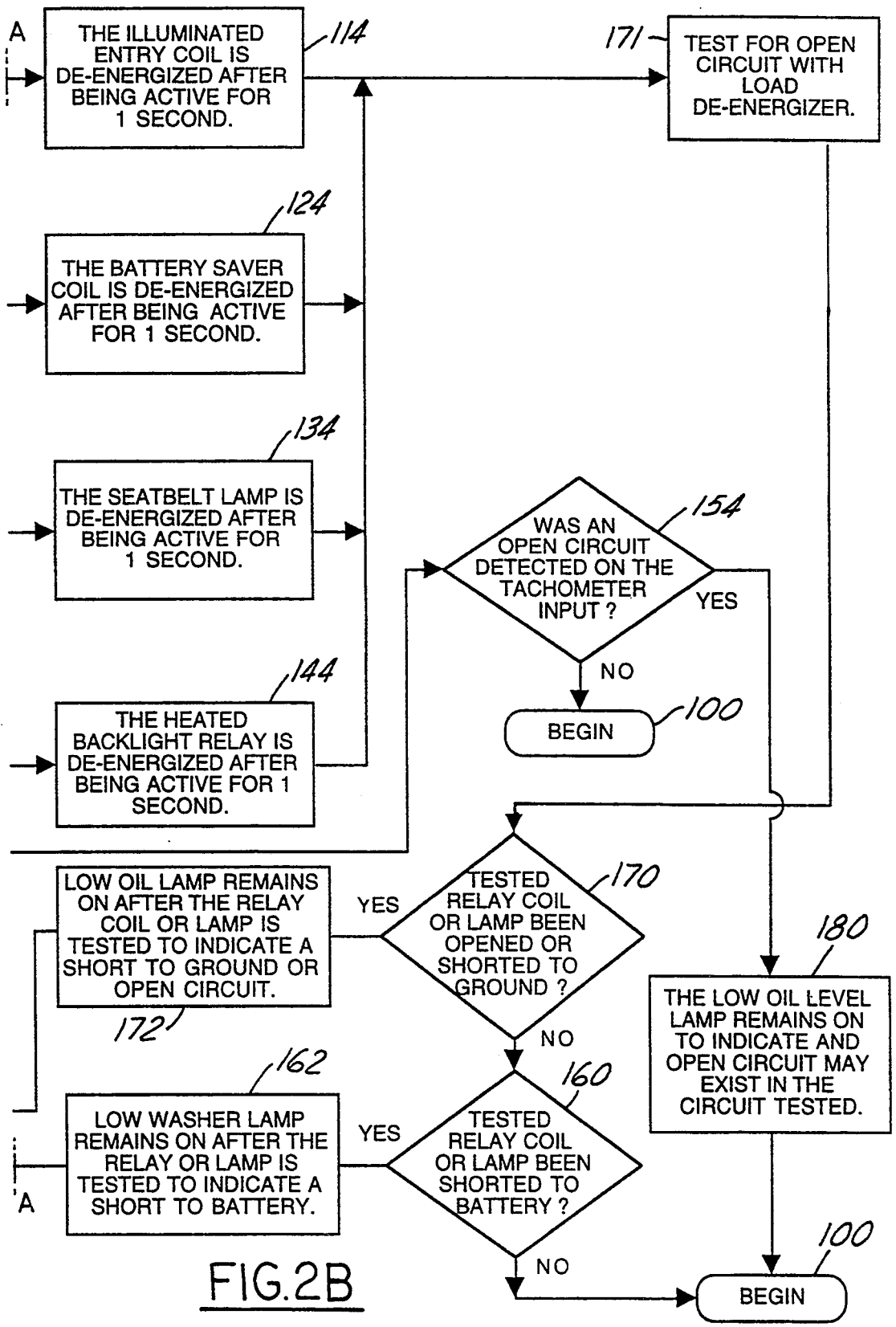

With reference to FIG. 2, the diagnostic software will now be discussed assuming that the ignition switch 20 has been actuated for placing the microcontroller 30 into the diagnostic mode. First, the software/firmware for the diagnostic program is executed starting at step 100. The diagnostic software consists of a series of conditional statements corresponding to sensing the actuation of one or more of the sensors. The conditional statements include steps 110, 120, 130, 140, and 150. Using conditional statement 110 as an example, if the software senses a signal from sensor 10 indicating that the door handle has been lifted, then the software moves to step 112 which activates the chime 70 in order to emit an audible tone indicating that the door handle sensor A signal was received on line 10 by the microcontroller, while at the same time illuminating the low oil level light (corresponding to power driver output a) and illuminating the low washer light (corresponding to power driver output b).

At the same time, in accordance with the diagnostic functioning of the software within the microcontroller 30, the output i of power driver 60 is energized to apply power to the illuminated entry light relay coil. At this time, power driver 60 checks output i for a short to the battery. After approximately one second step 114 is executed whereby the illuminated entry relay coil coupled to output i will be de-energized. In step 171 the relay coil is tested for an open circuit, and then the program moves to step 170.

As a second illustration of the diagnostic software, at step 120 if the headlamp switch changed state from ON to OFF or OFF to ON, then step 122 is executed, whereby the chime 70 is energized for sounding the chime confirming that the signal from the headlamp switch 12 has been properly received and processed by the microcontroller 30. Also at step 122, the output drivers a and b are also actuated, thereby energizing and illuminating the low oil level lamp 72 and the low washer fluid light 74 for one second. At the same time, output j of the power driver 60 is checked for a short to battery. After approximately one second, step 124 is executed where the battery saver coil is de-energized. At step 171 the relay coil is tested for an open circuit, and the program then proceeds to step 170.

As a general rule, the software will attempt to stimulate a power driver output that is directly associated with the input sensor function, but where no output is directly enabled as a result of the actuation of the input sensor, a closely related or functionally related output driver may be utilized instead.

Contrary to the example illustrated in step 110 wherein the illuminated entry coil and the low washer lamp 74 were illuminated responsive the the door handle being lifted, step 120 does not have a corresponding power driver output that can be controlled by the microcontroller 30, since the headlights are directly controlled by the headlamp switch and not through a power driver and the microcontroller.

In a similar manner, program step 130 senses if the seat belt has been buckled or unbuckled through sensor 14. If a signal is received from sensor 14, then the chime 70 is sounded and the low oil level and low washer level lamps 72 and 74 are illuminated for one second according to step 132. The fasten seat belt light 78 in the dashboard of the vehicle is illuminated under the control of power driver 60 at output k for one second to test for a short to the battery, and if its corresponding power driver output k does not find a short, then at step 134 after one second the seat belt lamp 78 is turned off. At step 171 the relay coil is tested for an open circuit, and the program then proceeds to step 170.

At step 140 the sensor 16 is sensed in order to determine if the heated back light switch has been actuated. If a signal is received from sensor 16, then the program moves to step 142 wherein the chime 70 is sounded and the low oil level and low washer level lamps 72 and 74 are both illuminated for one second. At the same time, the heated back light relay coil 79 coupled to output 1 of power driver 60 is energized for one second to test for a short to battery. At step 144 the heated back light relay coil 79 is then de-energized after one second. At step 171 the relay coil is tested for an open circuit, and the program then proceeds to step 170.

In general, if a fault was detected on an output during the open/short circuit testing, then the program jumps to step 170 to start the visual reporting process. If no short to ground or open is sensed at step 170, then the program proceeds to the step 160. If a short to ground or open is sensed at step 170, then the program proceeds to step 172 wherein the low oil level lamp 72 will continue to be energized (including after the relay coil and the lamp are de-energized) in order to indicate a short to ground or an open circuit. The program thereafter cycles through to step 100. If a relay coil, lamp, or other type load had been shorted to battery, then the program would proceed to step 162 wherein the low washer fluid lamp 74 remains on to indicate that the load had been shorted. The program then cycles to step 100. If the answer at step 160 is no, then the program proceeds directly to step 100.

At step 150, the ignition switch sensor 20 is interrogated in order to determine if it has been switched to the start position. If not, then the program proceeds to begin at step 100. If the ignition switch has been moved to the start position, then the program proceeds to step 152 wherein the chime 70 is sounded and the low oil level and washer level lamps 72 and 74 are illuminated for one second. Also, at step 152 the tachometer sensor 18 is tested for an open circuit. At step 154, if no signal is detected from the tachometer sensor 18, then the program proceeds to step 180 wherein the low oil level lamp 72 remains on to indicate an open circuit may exist in the tachometer circuit. The program then proceeds to begin step 100. Otherwise, if a tachometer signal is detected, then the program branches to the begin step 100.

In accordance with the present invention as explained in steps 150, 152, 154 and 180, it is possible to utilize the present apparatus and method to test not only a stimulated sensor, such as the ignition switch 20, but it is also possible to test an unassociated input, such as the tachometer input that was tested in steps 152 and 154. This aspect of the method is important because it will be recognized that there is no designated power driver output corresponding to the ignition switch sensor 20, since the ignition switch is directly coupled to the starter motor solenoid. More importantly, it will be recognized that there is a one to one correspondence between the testing of the input and the actuation of a power driver, even if the input does not have a sensor correlated thereto or an output driver correlated thereto.

It should also be apparent that the low oil level lamp 72 and low washer fluid lamp 74 functions have been chosen because their corresponding sensors are located in reservoirs not easily accessible for actual stimulation. These illuminated lights 72 and 74 are therefore available as indicators for designating the test of the power drivers, including the open and shorted conditions thereof. However, any available visual indicator could be used without departing from the thrust of the invention.

It should also be apparent that since the program cycles through steps 100, 110, 120, 130, 140, 150, etc., in less than 40 milliseconds, the test mode also could be used for locating intermittent faults of the type that are normally generated by loose or broken wires, loose or intermittent connector contacts, etc. This "wiggle testing" is accomplished by placing the module in the diagnostic mode, and then "wiggling" the cable harness, connectors, wires, or other components in the circuit. The chime 70 which will sound when the microcontroller senses a change of state in any one of the sensor inputs 10, 12, 14, 16, 18, 20, etc. coupled thereto. Therefore, this process may be utilized to detect an intermittent open condition, which is one of the most difficult defects to isolate in an automotive accessory wiring system. Since the software resets itself after one second, it would be possible to repetitively test specific sections of the wiring harness, and components such as connectors therein for their open or shorted conditions by repeatedly wiggling the section of wire. Through visual monitoring of the low oil level light and the low washer fluid light, it also may be possible to determine if the fault is a short or an open circuit. Finally, it may be possible to determine which of the circuits is defective by watching for the actuation of one of the lamps or actuators that is normally energized by the diagnostic test procedure in response to the corresponding defective sensor or wiring.

Once actuated, the module remains in the diagnostic mode until the ignition switch is turned off, or until the vehicle speed reaches 15 mph.

Therefore, the present invention has been illustrated as an example of a tester independent apparatus and method for diagnosing defects in an automotive electrical wiring system. This system is user dependent in that the testing technician is required to actuate one or more of the sensors normally utilized in the electrical system in order to enable the diagnostic sections of the invention. The present invention does not utilize additional displays, sensors, actuators, microcontrollers or other devices in the diagnostic process, nor does it require any electrical connections in the vehicle wiring harness to be broken or disturbed. Therefore, complexity and cost of the system are minimized and electrical system integrity is maintained.

Also, the system in accordance with the present invention is nonintrusive because no additional connections, insertions or couplings are required to exercise and diagnose system problems. Finally, since the sensors need not be actuated in any particular order, it is possible to provide great flexibility in testing and diagnosing the system problems. By the use of both audible and visual indicators, the present invention provides several means of direct feedback to the testing technician as to possible system problems and defects.

We claim:

1. A self-diagnostic method for determining operating faults in an automotive electrical system of the type having,
   a plurality of state sensors each for generating a corresponding sensing signal when changed between two or more states,
   a master controller for receiving the sensing signals from the sensors and responsive thereto generating at least one corresponding controller signal,
   a plurality of loads comprising either indicators or actuators, with each load for being actuated responsive to the stimulation of a corresponding one or more of the sensors, with at least one of the indicators also being designated as a first confirming indicator and at least another one of the indicators also being designated as a second confirming indicator,
   a plurality of power drivers each operatively coupled to the master controller and between a source of electrical energy and a corresponding one of the loads for coupling power thereto responsive to receiving a corresponding one of the controller signals,
wherein the self-diagnostic method includes the preliminary step of mechanically actuating a selected one of the sensors for placing the master controller out of an operating mode and into a test mode in which the first and second confirming indicators are actuated responsive to the first and second controller signals, but not in the operating mode, and further including the steps of:
   a. mechanically actuating a selected one of the sensors and responsive thereto generating a corresponding sensing signal,
   b. electrically actuating the first confirming indicator responsive to the master controller receiving and processing the corresponding sensing signal from the actuated sensor, and
   c. electrically actuating the second confirming indicator responsive to the master controller confirming that the power driver has coupled power to its corresponding load,
whereby the first confirming indicator will confirm that the corresponding sensing signal from the mechanically actuated sensor has been received and processed by the master controller, and the second confirming indicator will confirm that the master controller has actuated the corresponding power driver.

2. The method as described in claim 1 wherein said preliminary step includes the step of actuating an ignition switch in the automotive electrical system at least twice within a predetermined period of time.

3. The method as described in claim 1 wherein step b includes the step of generating a first confirming audible signal responsive to receiving the corresponding one of the sensing signals.

4. The method as described in claim 1 wherein step c includes the additional steps of:
   generating one confirming signal responsive to the master controller sensing that the corresponding power driver has coupled power to a defective shorted load, and generating another confirming signal responsive to the master controller sensing that the corresponding power driver has coupled power to a defective open load.

5. The method as described in claim 3 where:

step a includes the step of generating an audible warning signal as the first confirming indicator, and step b includes the step of generating a visual warning signal as the second confirming indicator.

6. A self-diagnostic system for determining operating faults in an automotive electrical system of the type having, a plurality of state sensors each for generating a corresponding sensing signal when mechanically actuated, a master controller for receiving the sensing signals from the sensors and responsive thereto generating a corresponding controller signal, a plurality of loads comprising either indicators or actuators, with each load for being electrically actuated responsive to the actuation of one or more of the sensors, with at least one of the indicators also being designated as a first confirming indicator and at least another one of the indicators also being designated as a second confirming indicator, and a plurality of power drivers each operatively coupled to the master controller and between a source of electrical energy and a corresponding one of the loads for coupling power thereto responsive to receiving a corresponding one of the controller signals, wherein the self-diagnostic system includes:

initiating means, coupled to and initiated responsive to the mechanical actuation of a selected one of the sensors, for switching the master controller from an operating mode and into a test mode in which said first and second confirming indicators are actuated responsive to first and second controller signals, but not in the operating mode, the master controller further including first means for actuating said first confirming indicator responsive to the master controller receiving and processing a corresponding sensing signal from an actuated sensor, and the master controller further including second means for actuating said second confirming indicator responsive to the master controller sensing that the power drive has coupled power to its corresponding load, whereby said first confirming indicator will confirm that the corresponding sensing signal has been received and processed by the master controller, and said second confirming indicator will confirm that the master controller has actuated the corresponding power driver when operating in the self-diagnostic mode.

7. The system as described in claim 6 wherein said initiating means includes an ignition switch for being mechanically actuated at least twice within a predetermined period of time for placing the master controller into the self-diagnostic mode.

8. The system as described in claim 6 wherein said first means includes means for generating an audible confirming signal responsive to receiving the corresponding one of the sensing signals.

9. The system described in claim 6 wherein said second means includes;

means for generating one confirming signal responsive to the master controller sensing that the corresponding power driver has coupled power to a defective shorted load, and means for generating another confirming signal responsive to the master controller sensing that the corresponding power driver has coupled power to a defective open load.

10. The system described in claim 9 wherein;

said first means and the loads include means for generating an audible warning signal as said first confirming indicator, and said second means and the loads include means for generating a visual warning signal as said second confirming indicator.

* * * * *